United States Patent
Krassnitzer et al.

(10) Patent No.: US 10,943,774 B2
(45) Date of Patent: Mar. 9, 2021

(54) SPUTTERING ARRANGEMENT AND SPUTTERING METHOD FOR OPTIMIZED DISTRIBUTION OF THE ENERGY FLOW

(71) Applicant: Oerlikon Surface Solutions AG, Pfäffikon, Pfäffikon (CH)

(72) Inventors: Siegfried Krassnitzer, Feldkirch (AT); Daniel Lendi, Grabs (CH); Denis Kurapov, Walenstadt (CH)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 339 days.

(21) Appl. No.: 15/775,827

(22) PCT Filed: Nov. 14, 2016

(86) PCT No.: PCT/EP2016/001891
§ 371 (c)(1),
(2) Date: May 12, 2018

(87) PCT Pub. No.: WO2017/080672
PCT Pub. Date: May 18, 2017

(65) Prior Publication Data
US 2018/0330931 A1    Nov. 15, 2018

Related U.S. Application Data

(60) Provisional application No. 62/254,451, filed on Nov. 12, 2015.

(51) Int. Cl.
*H01J 37/34* (2006.01)
*C23C 14/34* (2006.01)

(52) U.S. Cl.
CPC ...... *H01J 37/3467* (2013.01); *C23C 14/3485* (2013.01); *H01J 37/3444* (2013.01)

(58) Field of Classification Search
CPC ............... H01J 37/3467; H01J 37/3444; H01J 37/3464; C23C 14/3485
USPC ....................................... 204/298.08, 192.12
See application file for complete search history.

(56) References Cited

U.S. PATENT DOCUMENTS

2014/0248100 A1    9/2014  Krassnitzer

FOREIGN PATENT DOCUMENTS

| DE | 19651615 C1 | 7/1997 |
| DE | 102011018363 A1 | 10/2012 |
| WO | 2009132822 A2 | 11/2009 |
| WO | 2012143091 A1 | 10/2012 |

OTHER PUBLICATIONS

International Search Report dated May 18, 2017 in parent international application PCT/EP2016/001891 filed Nov. 14, 2016.
Written Opinion of the International Searching Authority dated May 18, 2017 in parent international application PCT/EP2016/001891 filed Nov. 14, 2016.

*Primary Examiner* — Rodney G McDonald
(74) *Attorney, Agent, or Firm* — Polson Intellectual Property Law, PC; Margaret Polson; Christopher Sylvain

(57) ABSTRACT

The present disclosure relates to a sputtering arrangement, a vacuum coating system, and a method for carrying out HiPIMS coating methods; the sputtering arrangement has at least two different interconnection possibilities and the switch to the second interconnection possibility, in which two sputtering sub-assemblies are operated simultaneously with high power pulses, achieves a productivity gain.

19 Claims, 7 Drawing Sheets

Duration of the output of the power $P_A = P_1+P_2+P_3$
by the power generators $G_4$ through $G_6$ Duration of the output of the power $P_B = P_4+P_5+P_6$
by the power generators $G_4$ through $G_6$

*Chronological output of the respective powers $P_1$ through $P_6$ by the power generators $G_1$ through $G_6$ on the respective sputtering cathodes T1 through T6*

SPUTTERING ARRANGEMENT AND SPUTTERING METHOD FOR OPTIMIZED DISTRIBUTION OF THE ENERGY FLOW

BACKGROUND

The present disclosure relates to a method for depositing PVD layer systems by means of cathodic vaporization, commonly described as sputtering. The present disclosure includes the use of pulses of high power density on a magnetron discharge and the optimal distribution of the energy flow to a plurality of magnetron components of a coating system.

In coating processes by means of sputtering, generally at least one target, which is connected as a cathode, is bombarded with ions from a plasma, which causes material to be eroded from the target. Usually, the ions are accelerated toward the target surface with the aid of an electrical field. Furthermore, an additional magnetic field is positioned, generally behind the target, which is connected as a cathode, so that electrons in the plasma are forced into a spiral path and circle above the target surface that is to be sputtered. This significantly increases the number of impacts per electron so that a higher ionization over the target surface is achieved, at least in a particular region, which results in an increased sputtering erosion on the target (also referred to below as the sputtering target or sputtering cathode) directly below this region. In this case, the erosion tracks that are typical for magnetron sputtering are produced and the region in which the electrons circle, i.e. above the erosion tracks being produced, is referred to as the racetrack.

High-power impulse sputtering, HiPIMS, is a particular type of sputtering or magnetron sputtering. In it, a high to very high sputtering power density (also referred to below as the power density) is used. The use of a high sputtering power density goes hand in hand with a high current density, which results in an ionization of the sputtered material. But processes are only referred to as HiPIMS starting from a sputtering power density of greater than 300 W/cm² or starting from a current density of greater than 0.5 A/cm². With conventional magnetron sputtering, the power density values are less than 100 W/cm². The area in this case is defined by the magnetron racetrack, a fact of which the specialist is aware.

In this context, power densities (sputtering power densities) of 100 W/cm² or more, in particular 300 W/cm² or more, are understood to be high power densities.

In order to prevent an overheating of the sputtered target material, usually also referred to as the sputtering target, in sputtering processes in which high power densities of this kind are used, particularly in HiPIMS, the sputtering power density must be applied in a pulse-like fashion. EP2272080B1 describes the pulse-like application of a sputtering power density. To this end, a capacitor is charged to a high voltage and is conveyed via a switch to the magnetron. By means of the high voltage and in the presence of sputtering gas, a magnetron discharge is ignited and the sputtering current increases as long as the capacitor can maintain the voltage. This method described in EP227080B1 is able to produce sputtering pulses with a duration of 10 µs to approx. 200 µs.

WO/2012/143091 describes a method for producing a sputtering power density that is applied sequentially to a plurality of sputtering targets $T_i$. It proposes dividing a cathode into sub-cathodes that are insulated from one another or instead of using one cathode, using a plurality of them and applying a definite sputtering power to the sub-cathodes or cathodes one after another in sequential fashion in such a way that they can be supplied with power pulses. In this connection, the sputtering power is the power that is produced by the power supply device that is used. In this case, a sputtering power generator G is used on a plurality of cathodes or sub-cathodes $T_i$ (in this case $T_1$, $T_2$, $T_3$, $T_4$, $T_5$, and $T_6$); power density pulses are sequentially applied to these sub-cathodes $T_i$, without interrupting the power consumption by the sputtering power generator G; and a respective power density pulse is applied to a sub-cathode $T_i$ during a corresponding pulse time $t_i$, as is outlined, for example, in FIG. 1 for a continuous power output of the power generator G during 2 periods (2 T). In such a case, the sputtering power density (or, as already mentioned above, also referred to as power density) is calculated based on the generator power P divided by the racetrack area on the corresponding sputter sputtering cathode $T_i$. The average power consumed, i.e. the average sputtering power of a sputtering cathode $Pav_i$ (e.g. in kW), is calculated based on the sputtering power density (e.g. in kW/cm²)×racetrack area at the corresponding sputtering cathode (e.g. in cm²)× switched-on duration (e.g. in s)×switching frequency (e.g. in s$^{-1}$).

In this context, the switched-on duration means the duration of the action of a power pulse on the sputtering cathode, i.e. the pulse time ti at the corresponding sputtering cathode $T_i$, and the switching frequency is defined as 1/T.

If a plurality N>2 of sputtering cathodes $T_i$ is used and each sputtering cathode $T_i$ is operated in a repeating sequence with a sequence duration equal to a period T, with the same preferably constant sputtering power P by the power generator G (also referred to as the pulse conduction P in this sense), if the pulse power is applied to each sputtering cathode $T_i$ in succession with as little time delay as possible between them, and if each pulse time $t_i$—during which the pulse power is applied to the respective sputtering cathode—is of equal length, then this yields the sputtering power consumed by a sputtering cathode $T_i$, i.e. the average sputtering power per sputtering cathode $Pav_i$:

$$Pav_i = Pav = P/N \qquad \text{Eq. 1}$$

Where:
$Pav_i$=average sputtering power per sputtering cathode
P=power from the generator
N=number of sputtering cathodes In the case of unequal pulse times per sputtering cathode ($t_1 \neq t_2 \ldots$), but an otherwise identical operating method (i.e. otherwise with a supply of the sputtering cathodes $T_i$ in a repeating sequence with a duration of the frequency equal to one period T, without interruption of the preferably constant sputtering power from the generator and without a time delay between the application of the pulse conduction to the respective sputtering cathodes during a period T), the following equations apply:

$$t_1 \neq t_2 \qquad \text{Eq. 2}$$

$$Pav_i P^* t_i / T \qquad \text{Eq. 3}$$

$$T = \Sigma_{i=1}^{N} t_i \qquad \text{Eq. 4}$$

$$F = 1/T \qquad \text{Eq. 5}$$

Where:
$Pav_i$=average sputtering power of the respective sputtering cathode
$t_i$=switched-on time (pulse time) of the respective sputtering cathode T=duration of the period of the respective repeating sequence
F=frequency with which the repeating sequence is repeated The variable i refers to each individual sputtering cathode of the sputtering arrangement, i.e. if the sputtering arrangement includes a number of N cathodes, then i respectively represents 1, 2, 3, . . . through N.

The HiPIMS method is preferably used to produce an ionized material vapor from the material to be sputtered and to produce thin layers through the application of a negative substrate bias voltage. The degree of ionization of the ionized material vapor depends on the current density or in this case on the sputtering power density of the magnetron discharge. It is also known that with high ionization of the sputtered particles, a flow of the ions back to the sputtering target (i.e. to the sputtering cathode) occurs and thus a decrease in the coating rate.

FIG. 2 shows the curve of the specific coating rate in μm/KW·h as a function of the applied sputtering power density. The specific coating rate can be viewed as the coating rate per average sputtering power because it is defined by the layer thickness per unit time (for example coating time) per average sputtering power; the average sputtering power in turn is defined by the sputtering power density×racetrack area per sputtering cathode, as shown in equation 6:

$$R_{specif\_i}=R/Pav_i \qquad \text{Eq. 6}$$

Where:
$R_{specif\_i}$=specific coating rate in μm/kW·h
R=coating rate in μm/h
$Pav_i$=average sputtering power of the respective sputtering cathode The data in FIG. 2 were measured in a titanium discharge (i.e. a sputtering discharge with titanium as the sputtering cathode material). In this example, the specific coating rate decreases to about half from approx. 6.5 μm/kW·h to approx. 3.5μ/kW·h) due to the increase in the sputtering power density from 500 W/cm$^2$ to 1800 W/cm$^2$. This means that coating processes with higher sputtering power densities are less productive.

As described in WO/2012/143091 and as is clear from Eq. 1, with the use of power pulses that are applied sequentially and in a chronologically uniform fashion to a plurality of sputtering cathodes one after another in a row, the average sputtering power per sputtering cathode is determined by the sputtering power (also called the pulse power) that is set at the sputtering generator or at the power supply device and the number of involved sputtering cathodes. This in turn means that the power P that is set at the power generator G can be reduced in order to intentionally reduce the sputtering power density so that the specific coating rate is increased by thus inevitably reducing the average sputtering power per sputtering cathode $Pav_i$ if aside from this, all other set parameters of the arrangement remain the same (unchanged). But this results in the contradictory situation that although the coating rate per average sputtering power should mathematically increase due to the use of a lower sputtering power density, the average sputtering power per sputtering cathode itself decreases and thus in this way, no productivity gain can be achieved. This will be explained in greater detail based on FIG. 3.

FIG. 3 shows the curve of the coating rate as a function of the sputtering power density in an arrangement with 6 sub-cathodes as shown in FIG. 1, taking into account the specific coating rate of titanium as a function of the sputtering power density when only the pulse power P set at the power generator is varied in order to thus vary the sputtering power density (per sputtering cathode). This clearly shows that with a reduction of the sputtering power density through the reduction of the pulse conduction P in such a HiPIMS arrangement, the average sputtering power decreases so sharply that the specific coating rate also decreases because the coating rate itself decreases more sharply than the average sputtering power.

In this connection, it is also problematic that based on the low flexibility for the setting of the power density (and thus also the degree of ionization) of such a HiPIMS arrangement, there is also a low flexibility for the depositing of layers with different layer properties because many layer properties are influenced by the sputtering power density and the degree of ionization, which also depends on the target material. With such an arrangement, it is also very difficult to optimize the coating rate, which relates to the sputtering power set at the power generator, in order to achieve a gain in productivity.

The foregoing examples of the related art and limitations therewith are intended to be illustrative and not exclusive. Other limitations of the related art will become apparent to those of skill in the art upon a reading of the specification and a study of the drawings.

SUMMARY

Proceeding from the foregoing, an aspect of the present disclosure is to provide a sputtering arrangement and a method for carrying out coating processes by means of pulsed sputtering, in particular by means of sputtering with high power density pulses or more precisely, by means of HiPIMS, which makes it possible to vary the sputtering power density without resulting in a loss of productivity. The following embodiments and aspects thereof are described and illustrated in conjunction with systems, tool and methods which are meant to be exemplary and illustrative, not limiting in scope. In various embodiments, one or more of the above described problems have been reduced or eliminated, while other embodiments are directed to other improvements.

An aspect of the present disclosure is attained by providing a sputtering arrangement with a network of sputtering power generators $G_j$, which each produce a pulse power $P_j$.

The present disclosure relates to a sputtering arrangement, a vacuum coating system, and a method for carrying out HiPIMS coating methods; the sputtering arrangement has at least two different interconnection possibilities and the switch to the second interconnection possibility, in which two sputtering sub-assemblies are operated simultaneously with high power pulses, achieves a productivity gain.

The present disclosure will be explained in detail based on the following examples:

A number N of sputtering cathodes $T_i$ should be connected to a number n of sputtering generators $G_j$ (also referred to as sputtering power generators below) in order to achieve the fact that the result $Pav_i=P\times t_i/T$ represents an optimum or maximum for all values of the power P that determine the sputtering power density; in this example, the power P is defined as the sum of the powers $P_j$ output by the power generators: $P=\Sigma_{j=1}^{n}Pj$.

FIG. 4a shows a sputtering arrangement of the present disclosure by way of example, which comprises a network of sputtering power generators $G_j$. FIG. 4b shows the accompanying chronological distribution of the sputtering power pulses $t_i$, where:

$P_j$=sputtering power, which is defined by the respective power generator $G_j$, for example in FIG. 4 n equals 6, i.e. the coefficient j varies from 1 to 6 in this example $Sb_j$=bridge switch for switching the power output $P_j$ of the respective power generator $G_j$ $Sp_i$=pulse switch for sequentially supplying power to the respective sputtering cathode $T_i$ (for sequentially applying sputtering power to the respective sputtering cathodes $T_i$); in FIG. 4, for example, N equals 6, i.e. the coefficient j in this example varies from 1 to 6; each sputtering cathode $T_i$ is supplied with a sputtering power P, which in this case corresponds to the sum of the power outputs of the power generators, i.e. $P=\Sigma_{j=1}^{n} Pj$ In the sputtering analogously shown in FIG. 4a, the power output of the 6 sputtering generators is logically interconnected by means of the bridge switch in such a way that a total sputtering power P, which is the sum of the power outputs $P_j$ of the respective power generators $G_j$, is supplied (i.e. $P=\Sigma_{j=1}^{n} Pj$ where n=6 then $P=P_1+P_2+P_3+P_4+P_5+P_6$). Through a pulse sequence generation, for example by means of controlled IGBT switches Sp1 through Sp6, a sequence of power pulses can be generated as shown in FIG. 4b. The individual power pulses have a pulse power (amplitude) P. The plurality of power generators is operated without interruption.

With the same pulse time i.e. $t_i=t_{i+1}$ (that is $t_1=t_2=t_3=t_4=t_5=t_6$ in this example) and the same power output of the individual power generators, i.e. $P_1=P_2=P_3=P_4=P_5=P_6$, the following equations apply:

$$Pav_i = 6 \times P_j/6 = P_j$$

$$P = 6 * Pg_j$$

FIGS. 5a and b show the same sputtering arrangement of the present disclosure as the one shown in FIG. 4, but with another interconnection of the present disclosure of the bridge circuit in which the sputtering cathodes are operated in two separate sputtering sub-arrangements.

As is clear from FIG. 5a, the opening of the bridge switch Sb3 causes the power generators to be logically interconnected in two groups, i.e. in this example, three of the power generators ($G_1$, $G_2$, and $G_3$) are logically interconnected in a first sub-arrangement A for providing a first pulse power $P_A=P_1+P_2+P_3$ and the other three power generators ($G_4$, $G_5$, $G_6$) are logically interconnected in a second sub-arrangement B for supplying a second pulse power $P_B=P_4+P_5+P_6$. In a similar way, three respective sputtering cathodes are made available to the first sub-arrangement and the other three sputtering cathodes are made available to the second sub-arrangement in such a way that for example the sputtering cathodes $T_1$, $T_2$, and $T_3$ are supplied with the first pulse power $P_A$ in pulsed, sequential fashion and the other three sputtering cathodes $T_4$, $T_5$, and $T_6$ are supplied with the second pulse power $P_B$ in pulsed, sequential fashion.

In this way, the wiring of the IGBT switches Sp1 through Sp3 and Sp4 through Sp6 can then be carried out in entirely separate pulse sequences or in synchronous pulse sequences with the same or different pulse times $t_i$ and also with the same or different periods $T_A$ and $T_B$. It should be noted that the pulse powers $P_A=P_1+P_2+P_3$ and $P_B=P_4+P_5+P_6$ are lower than the total pulse power $P=P_1+P_2+P_3+P_4+P_5+P_6$. Thus, with the interconnection in two sub-arrangements, as shown in FIG. 5, to the sputtering cathodes $T_i$ in comparison to the interconnection of the sputtering arrangement, as shown in FIG. 4, a lower sputtering power density per sputtering cathode is applied. The average sputtering power $Pav_i$ per sputtering cathode in the sub-arrangements in FIG. 5, however, remains the same as in the sputtering arrangement in FIG. 4.

According to the present disclosure and in accordance with the insight in FIG. 2, the total coating rate with the interconnection of these two sub-arrangements is then greater than with the interconnection of a single sputtering arrangement, as in FIG. 4.

With the same pulse time $t_i$ of the individual power pulses $P_j$ at the individual sputtering cathodes $T_i$ (i.e. with $t_1=t_2=t_3=t_4=t_5=t_6$) and the same output power of the individual power generators $G_i(P_1=P_2=P_3=P_4=P_5=P_6)$, the following equations apply:

$$Pav_{iA}=Pav_{iB}=n_A*P_j/n_A=n_B*P_j/n_B=3*P_i/3=P_i$$

$$Pav=P_j$$

pulse power in the A and B sub-arrangements=$P_A=P_B=3*Pj$

FIGS. 6a and b show a third logical interconnection of the sputtering arrangement of the present disclosure, which according to the present disclosure can also be interconnected as already demonstrated in FIG. 4 and FIG. 5. With this set-up, all of the bridge switches are open. Each sputtering cathode $T_i$ is associated with an individual power generator. The sputtering power $P_C$ for each sputtering cathode $T_i$ then corresponds to $P_j$. This further reduces the sputtering power density. The average sputtering power, however, is the same as in the interconnections already shown above by way of example in FIG. 4 and FIG. 5. According to the insight depicted in FIG. 2, with this third interconnection, the coating rate is greater compared to that from the set-ups in FIG. 4 and FIG. 5.

With the same power $P_j$ of the individual generators ($G_j$), the following equations apply:

$$Pav=P_j$$

pulse power=$P_C=P_j$

From the above descriptions based on a sputtering arrangement of the present disclosure comprising 6 sputtering generators and 6 targets (sputtering cathodes), the expert can easily infer an expansion to a number n of generators and likewise to a number N of sputtering cathodes, in which n≠6 and/or N≠6.

Examples of coating rates:

FIG. 7 shows the coating rate gain when the sputtering arrangement of the present disclosure is switched from the interconnection in FIG. 4 to the interconnection in FIG. 5. Different sputtering materials were interconnected in sputtering cathodes according to the set-ups in the examples in FIG. 4 and FIG. 5 and corresponding coatings were deposited.

The sputtering power density here in the case of the interconnection according to FIG. 4 was 1800 W/cm$^2$ and in the case of the interconnection according to FIG. 5 was 900 W/cm$^2$. The average sputtering power was the same in both cases. It was possible to ascertain a coating rate increase for all of the sputtering materials, as shown in FIG. 7. If the power density in the sputtering arrangement with the interconnection according to FIG. 4 had been reduced by reducing the pulse power P, then the coating rate would also have been reduced practically to half and this would have not achieved any coating rate gain and thus also no gain in productivity.

In addition to the aspects and embodiments described above, further aspects and embodiments will become apparent by reference to the accompanying drawings and the detailed description forming a part of this specification.

Figure 1:
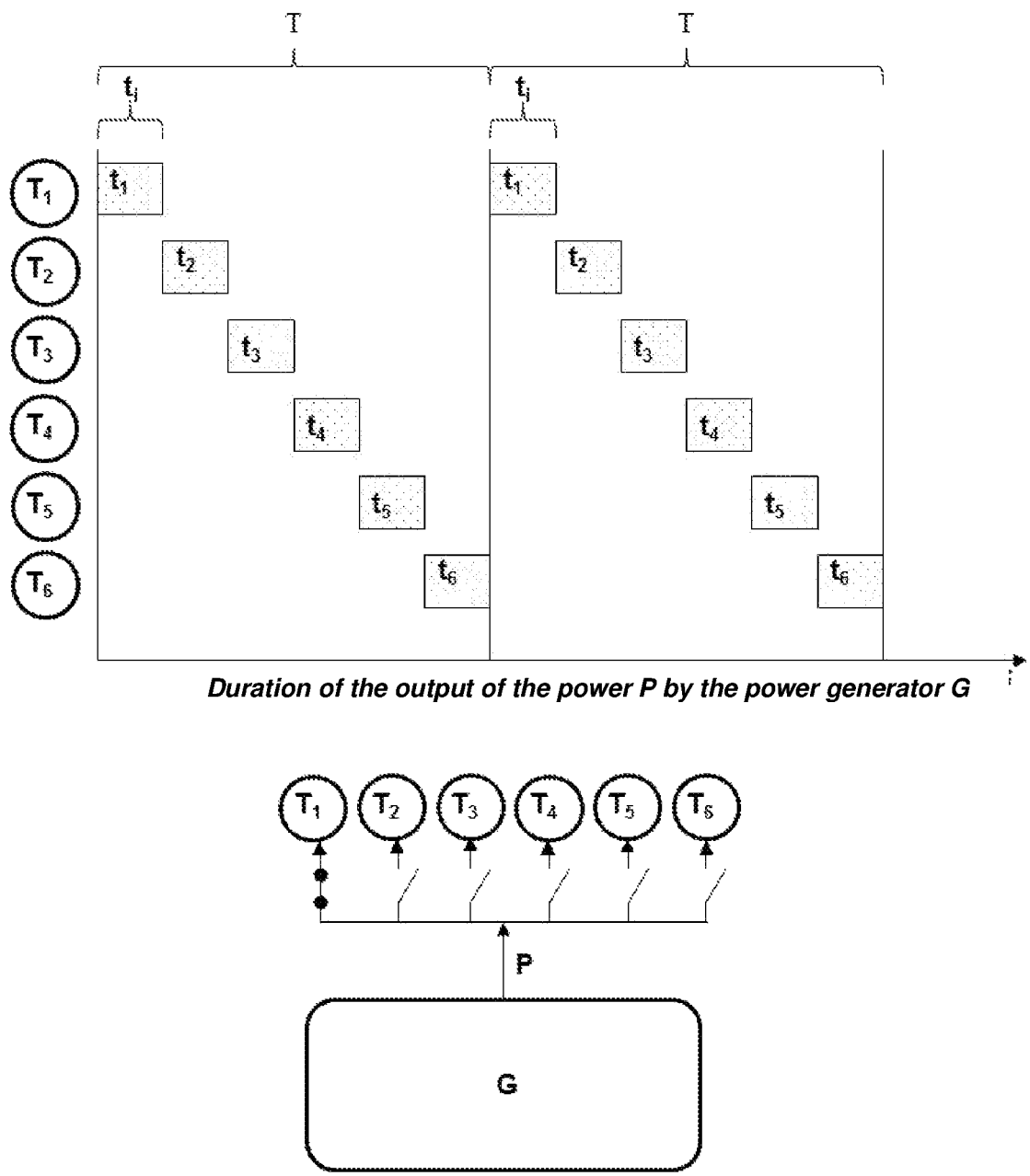
FIG. 1 shows a chronological distribution of power pulses (also called sputtering pulses) with the pulse conduction P in a sputtering arrangement with six sub-cathodes $T_1$ through $T_6$ (also called sputtering cathodes). The power pulses are sequentially applied one after another to the six sub-cathodes, without interrupting the power consumption by the sputtering generator G, where $t_1$ is the pulse time of the power pulse that is applied to the first sub-cathode $T_1$ during a period T and in a similar way, $t_2$ is the pulse time of the power pulse that is applied to the second sub-cathode $T_2$ during the same period T, and so on; in this example, the pulse time $t_i$ with i=1 to 6 was selected so that $t_1=t_2=t_3=t_4=t_5=t_6$. The chronological sequence of the transmission of the sputtering power from one target (sputtering cathode in this context) to the other takes place, as already mentioned above, without interrupting the power P from the point of view of the generator. The sequence $t_1$ through $t_6$ repeats with the period T and likewise takes place without interruption from the point of view of the generator. In the example in FIG. 1, the pulse times $t_1$ through $t_6$ are shown as being of the same length. Each pulse time $t_i$ of a sub-cathode $T_i$, however, can be set individually.
Figure 2:
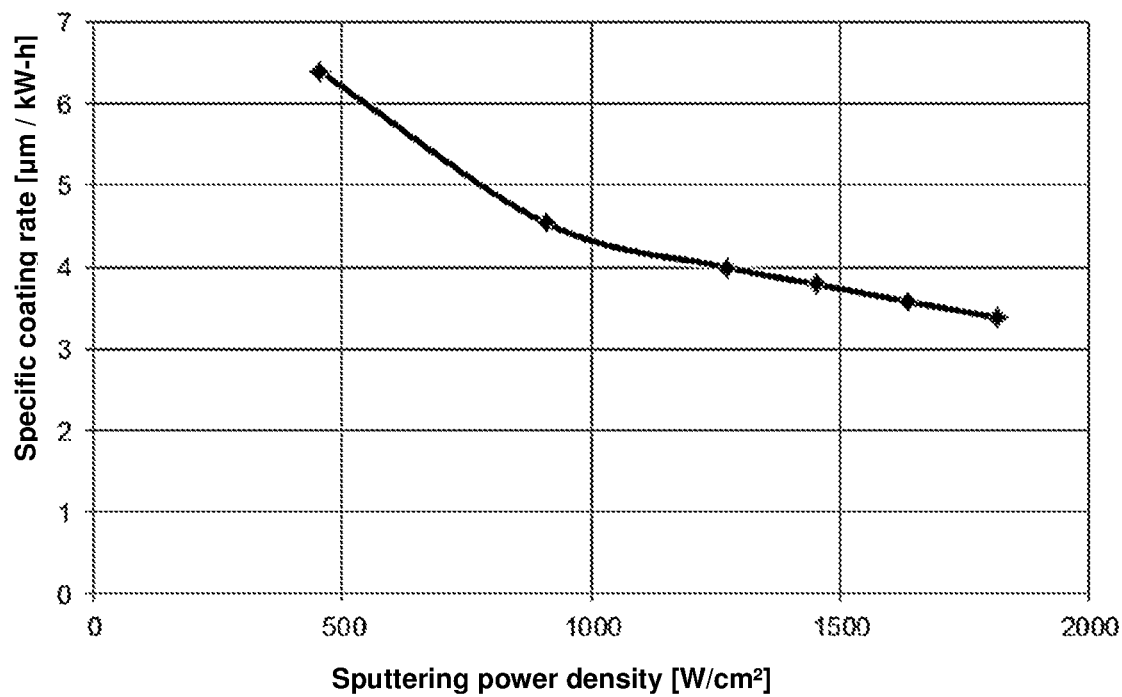
FIG. 2 shows the curve of the specific coating rate of titanium as a function of the sputtering power density.
Figure 3:
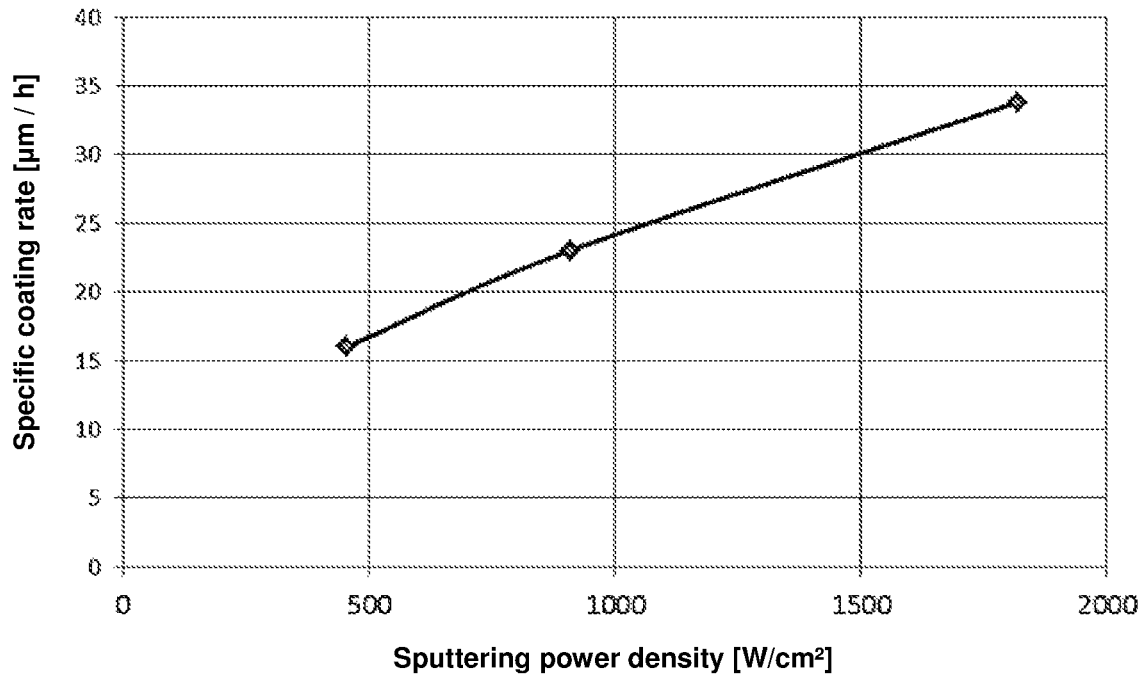
FIG. 3 shows the curve of the coating rate as a function of the sputtering power density according to the sputtering arrangement with 6 sub-cathodes, as shown in FIG. 1, taking into account the specific coating rate of titanium as a function of the sputtering power density.
Figure 4A:
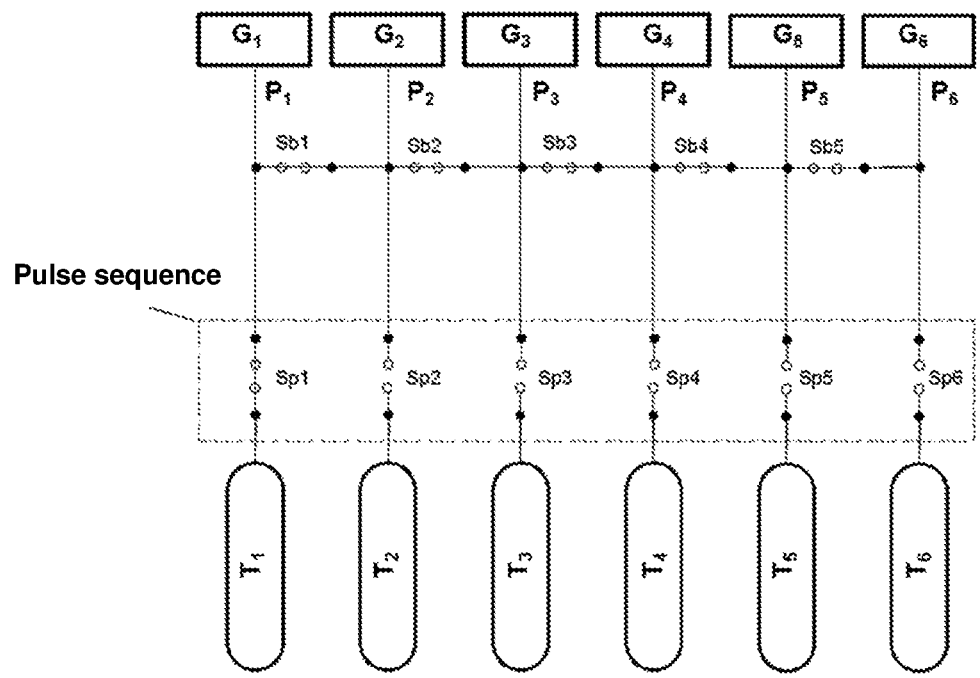
FIG. 4 (includes FIGS. 4a and 4b) shows an embodiment of a sputtering arrangement of the present disclosure with a networking according to the present disclosure of sputtering generators (FIG. 4a), which are logically interconnected in order to enable an associated chronological distribution of the sputtering power pulses; the pulse conduction is respectively $P=P_1+P_2+P_3+P_4+P_5+P_6$ and the sputtering power pulses are applied to the respective sub-cathodes $T_i$ during a particular pulse time $t_i$, i.e. are applied to the sub-cathode $T_1$ during a pulse time $t_1$ and are applied to the sub-cathode $T_2$ during a pulse time $t_2$, etc.
(FIG. 4b).
Figure 4B:
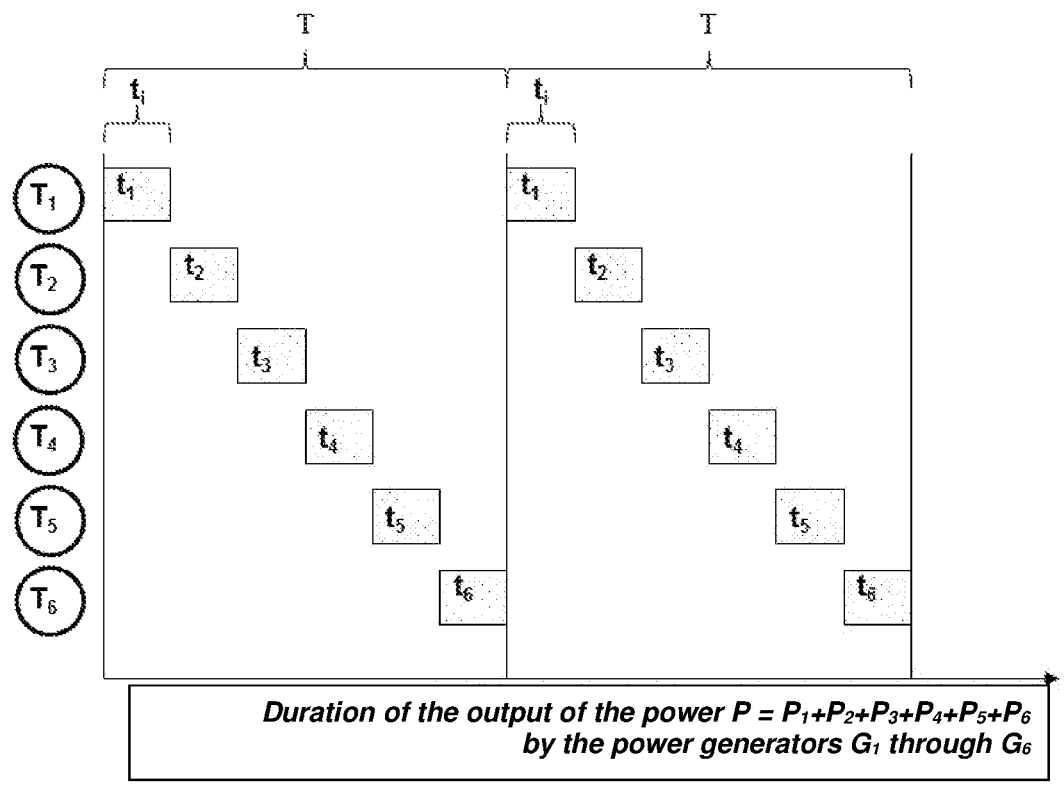
Figure 5A:
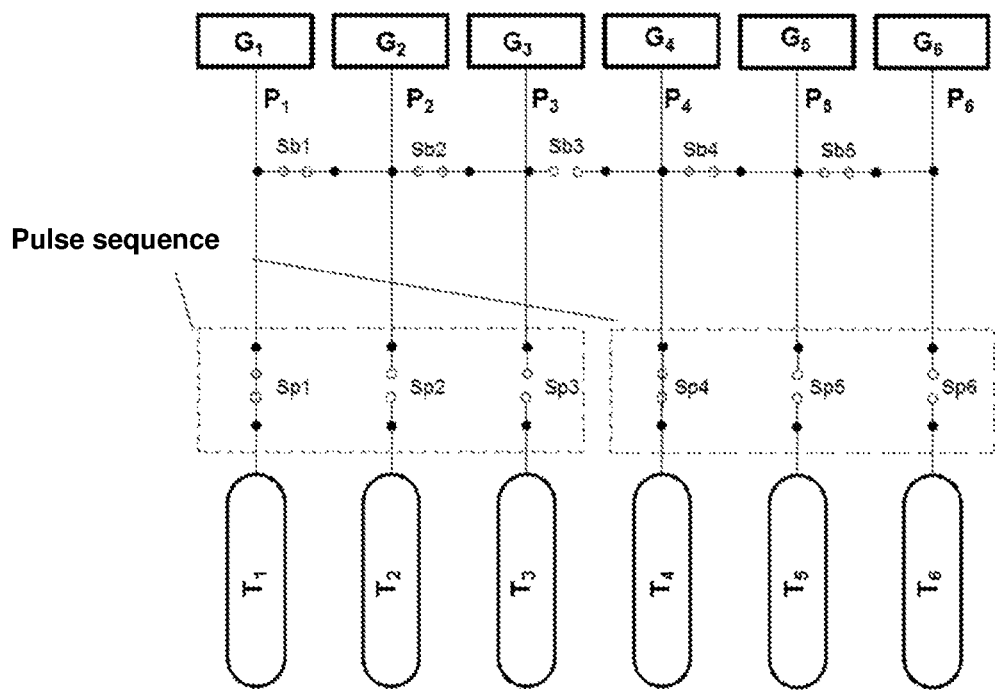
FIG. 5 (includes FIGS. 5a and 5b) shows the same embodiment of a sputtering arrangement of the present disclosure as in FIG. 4, but in another interconnection of the present disclosure (FIG. 5a), which makes it possible for the sputtering arrangement to be simultaneously operated in two different sputtering sub-arrangements A and B.
FIG. 5b shows the corresponding chronological distribution of power pulses in the sputtering sub-arrangements; the power in sub-arrangement A is $P_A=P_1+P_2+P_3$ and the power in sub-arrangement B is $P_B=P_4+P_5+P_6$.
Figure 5B:
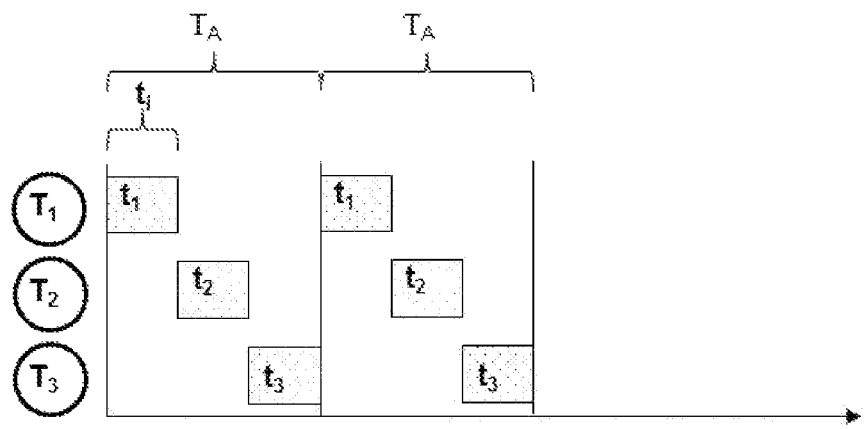
Figure 5B:
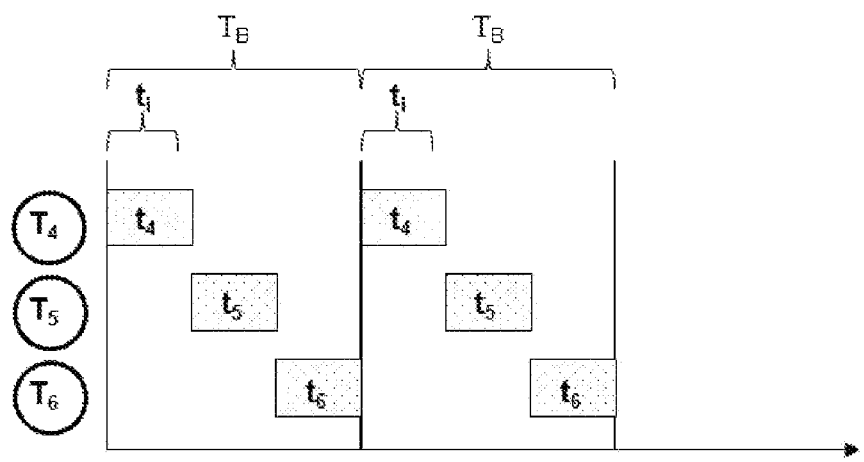
Figure 6A:
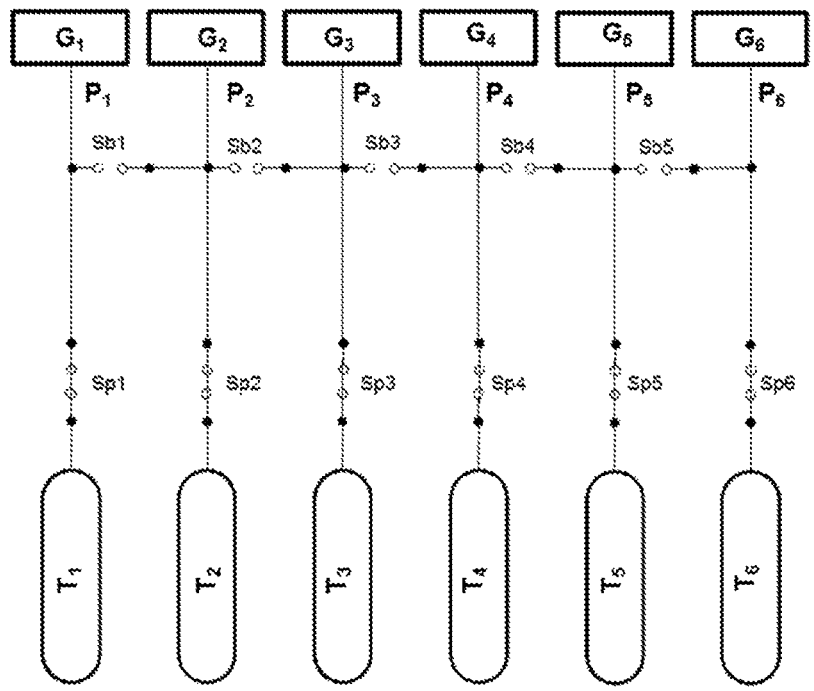
FIG. 6 (includes FIGS. 6a and 6b) shows the same embodiment of a sputtering arrangement of the present disclosure as in FIG. 4 and FIG. 5, but in another interconnection of the present disclosure (FIG. 6a) in which power pulses are no longer generated, but instead, the respective sputtering cathodes are continuously supplied separately with the power of the respective sputtering power generators $G_1$ through $G_6$, as shown in FIG. 6b.
Figure 6B:
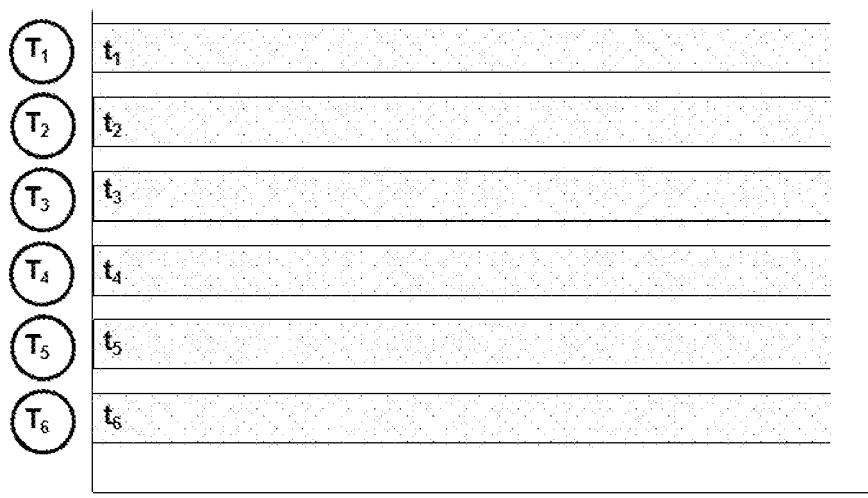
Figure 7:
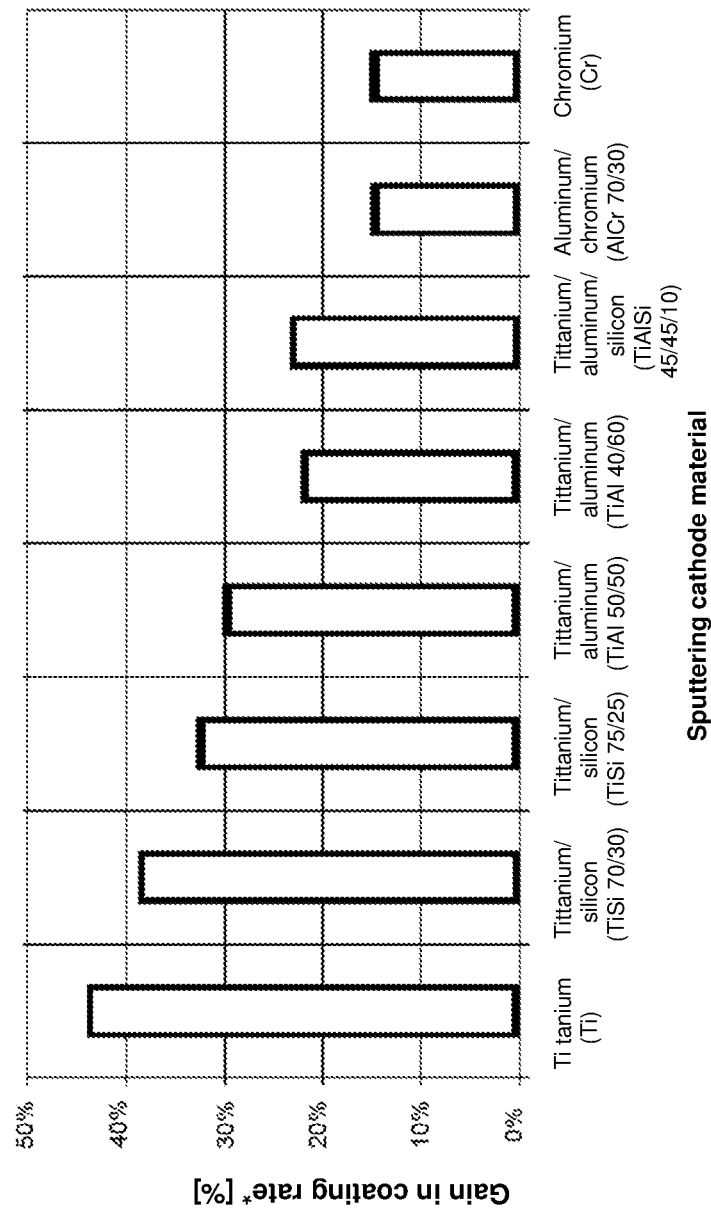
FIG. 7 shows the coating rate gain when the sputtering arrangement of the present disclosure is switched from the interconnection in FIG. 4 to the interconnection in FIG. 5

Before further explaining the depicted embodiments, it is to be understood that the invention is not limited in its application to the details of the particular arrangements shown, since the invention is capable of other embodiments. It is intended that the embodiments and figures disclosed herein are to be considered illustrative rather than limiting. Also, the terminology used herein is for the purposes of description and not limitation.

DETAILED DESCRIPTION

The present disclosure specifically discloses the following:

A sputtering arrangement with a number N of sputtering cathodes or sub-cathodes $T_i$ with i=1 through N, and a number n of sputtering power generators $G_j$ with j=1 through n, where N is a whole number and N≥2 and n is also a whole number and n≥2; the sputtering arrangement comprises bridge switches $Sb_j$ for switching the power output $P_j$ of the respective sputtering power generator $G_j$, and pulse switches $Sp_i$ for distributing the respective power outputs $P_j$ to the respective sputtering cathodes $T_i$; the sputtering arrangement is assembled so that it can be operated in at least two different interconnection possibilities; and:

In the first interconnection variant, the respective power outputs $P_j$ of the n sputtering power generators $G_j$ can be logically interconnected by means of the bridge switches so that a total sputtering power P is supplied, which corresponds to the sum of the power outputs $P_j$, i.e. $P=\Sigma_{j=1}^{n}Pj$; and through a pulse sequence generation by means of the respective pulse switches, a sequence of power pulses with pulse power P and sequence period T is produced; the individual power pulses are chronologically distributed to the respective sputtering cathodes $T_i$; the sputtering cathodes are respectively supplied with power during a pulse time $t_i$; and a period T corresponds to the sum of the pulse times, i.e. $T=\Sigma_{i=1}^{N}t_i$, and in the second interconnection variant, the sputtering cathodes are operated in at least two separate sputtering sub-arrangements A and B; in order to operate the sputtering sub-arrangements, the respective power outputs of a number nA of sputtering generators and a number nB of sputtering generators can be logically interconnected by means of the bridge switches so that a first pulse power $P_A=\Sigma_{j=1}^{nA}Pj$ and a second pulse power $P_B=\Sigma_{j=nA}^{n}Pj$ are supplied, where nA+nB=n, and where through the respective generation of pulse sequence by means of the respective pulse switches, a respective first sequence of power pulses with a pulse power $P_A$ and a sequence period $T_A$ and second sequence of power pulses with a pulse power $P_B$ and a sequence period $T_B$ are produced; the individual power pulses are chronologically distributed to the sputtering cathodes of the respective sputtering sub-arrangements, where NA corresponds to the number of sputtering cathodes of the first sputtering sub-arrangement A and NB corresponds to the number of sputtering cathodes of the second sputtering sub-arrangement B and NA+NB=N, and the sequence period $T_A$ corresponds to the sum of the pulse times for the sputtering cathodes of the first sputtering sub-arrangement A and the sequence period $T_B$ corresponds to the sum of the pulse times for the sputtering cathodes of the second sputtering sub-arrangement B, i.e. $T_A=\Sigma_{i=1}^{NA}ti$ and $T_B=\Sigma_{i=NA}^{N}ti$.

A vacuum coating system with a sputtering arrangement of the present disclosure as described above; the sputtering arrangement is assembled in such a way that during the execution of a sputtering method, high power pulses can be used, which permit the use of high sputtering power densities of 100 W/cm² or greater, in particular 300 W/cm2 or greater.

A vacuum coating system as described above, preferably in which N=n.

A vacuum coating system as described above, preferably in which $P_A=P_B$

A vacuum coating system as described above, preferably in which $P=P_A+P_B$

A vacuum coating system as described above, preferably in which NA=NB and/or nA=nB A method for coating substrates by means of HiPIMS in which the HiPIMS method is carried out in a vacuum coating system like one of the inventive vacuum coating systems described above.

A method as described above in which at least in order to deposit a layer by means of HiPIMS methods, the sputtering arrangement is switched to an interconnection variant with at least two sputtering sub-arrangements and a coating rate gain is achieved in comparison to a HiPIMS method, which would be carried out with the sputtering arrangement in a first interconnection variant.

The invention was described based on exemplary embodiments. A person skilled in the art will derive numerous embodiments for implementing the invention without departing from the scope of the present claims. While a number of aspects and embodiments have been discussed above, those of skill in the art will recognize certain modifications, permutations, additions and sub-combinations therefore. It is therefore intended that the following appended claims hereinafter introduced are interpreted to include all such modifications, permutations, additions and sub-combinations, which are within their true spirit and scope. Each embodiment described herein has numerous equivalents.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims. Whenever a range is given in the specification, all intermediate ranges and subranges, as well as all individual values included in the ranges given are intended to be included in the disclosure. When a Markush group or other grouping is used herein, all individual members of the group and all combinations and sub-combinations possible of the group are intended to be individually included in the disclosure.

In general, the terms and phrases used herein have their art-recognized meaning, which can be found by reference to standard texts, journal references and contexts known to those skilled in the art. The above definitions are provided to clarify their specific use in the context of the invention.

The invention claimed is:

1. A sputtering arrangement comprising:
a number N of sputtering cathodes or sub-cathodes $T_i$ with i=1 to N, and a number n of sputtering power generators $G_j$ with j=1 to n, wherein N is a whole number and N≥2 and n is also a whole number and n≥2;

said sputtering arrangement further comprising bridge switches Sbj for switching the power output Pj of the respective sputtering power generator Gj, and pulse switch Spi for distributing the respective power outputs Pj to the respective sputtering cathodes Ti;

said sputtering arrangement is assembled so that it is operateable in at least two different interconnection variants, and:

in a first interconnection variant, the respective power outputs $P_j$ of the n sputtering power generators $G_j$ are correspondingly interconnected by means of the bridge switches so that a total sputtering power P is supplied, which corresponds to the sum of the power outputs $P_j$ ($P=\Sigma_{j=1}^{n}Pj$), and through a pulse sequence generation by means of the respective pulse switches, a sequence of power pulses with pulse power P and sequence period T is produced; the individual power pulses are chronologically distributed to the respective sputtering cathodes $T_i$; the sputtering cathodes are respectively supplied with power during a pulse time $t_i$; and the period T corresponds to the sum of the pulse times ($T=\Sigma_{i=1}^{N}t_i$); and in a second interconnection variant, the sputtering cathodes are operated in at least two separate sputtering sub-arrangements A and B; in order to operate the sputtering sub-arrangements, the respective power outputs of a number nA of sputtering generators and a number nB of sputtering generators are correspondingly interconnected by means of the bridge switches so that a first pulse power $P_A$ ($P_A=\Sigma_{j=1}^{nA}Pj$) and a second pulse power $P_B$ ($P_B=\Sigma_{j=nA}^{n}Pj$) are supplied, where nA+nB=n, and where through the respective generation of pulse sequence by means of the respective pulse switches, a respective first sequence of power pulses with the pulse power $P_A$ and a sequence period $T_A$ and second sequence of power pulses with the pulse power $P_B$ and a sequence period $T_B$ are produced; the individual power pulses are chronologically distributed to the sputtering cathodes of the respective sputtering sub-arrangements, where NA corresponds to the number of sputtering cathodes of the first sputtering sub-arrangement A and NB corresponds to the number of sputtering cathodes of the second sputtering sub-arrangement B, where NA+NB=N, and the sequence period $T_A$ corresponds to the sum of the pulse times for the sputtering cathodes of the first sputtering sub-arrangement A and the sequence period $T_B$ corresponds to the sum of the pulse times for the sputtering cathodes of the second sputtering sub-arrangement B ($T_A=\Sigma_{i=1}^{NA}ti$ and $T_B=\Sigma_{i=NA}^{N}ti$).

2. A vacuum coating system with a sputtering arrangement according to claim 1, wherein the sputtering arrangement is assembled in such a way that during the execution of a sputtering method, high power pulses can be used, which permit the use of high sputtering power densities of 100 W/cm2 or greater.

3. The sputtering arrangement of claim 1, wherein N=n.

4. The vacuum coating system of claim 2, wherein N=n.

5. The sputtering arrangement of claim 1, wherein PA=PB.

6. The vacuum coating system of claim 2, wherein PA=PB.

7. The sputtering arrangement of claim 1, wherein P=PA+PB.

8. The vacuum coating system of claim 2, wherein P=PA+PB.

9. The sputtering arrangement of claim 1, wherein NA=NB and/or nA=nB.

10. The vacuum coating system of claim 2, wherein NA=NB and/or nA=nB.

11. A method for coating substrates by means of HiPIMS in which the HiPIMS method is carried out in a vacuum coating system with a sputtering arrangement, said sputtering arrangement comprising a number N of sputtering cathodes or sub-cathodes Ti with i=1 to N, and a number n of sputtering power generators Gj with j=1 to n, wherein N is a whole number and N≥2 and n is also a whole number and n≥2; the sputtering arrangement further comprising bridge switches Sbj for switching the power output Pj of the respective sputtering power generator Gj, and pulse switch Spi for distributing the respective power outputs Pj to the respective sputtering cathodes Ti; wherein the sputtering arrangement is assembled so that it is operateable in at least two different interconnection variants, and:

in a first interconnection variant, the respective power outputs $P_j$ of the n sputtering power generators $G_j$ are correspondingly interconnected by means of the bridge switches so that a total sputtering power P is supplied, which corresponds to the sum of the power outputs $P_j$ ($P=\Sigma_{j=1}^{n}Pj$), and through a pulse sequence generation by means of the respective pulse switches, a sequence of power pulses with pulse power P and sequence period T is produced; the individual power pulses are chronologically distributed to the respective sputtering cathodes $T_i$; the sputtering cathodes are respectively supplied with power during a pulse time $t_i$; and the period T corresponds to the sum of the pulse times ($T=\Sigma_{i=1}^{N}t_i$); and in a second interconnection variant, the sputtering cathodes are operated in at least two separate sputtering sub-arrangements A and B; in order to operate the sputtering sub-arrangements, the respective power outputs of a number nA of sputtering generators and a number nB of sputtering generators are correspondingly interconnected by means of the bridge switches so that a first pulse power $P_A$ ($P_A=\Sigma_{j=1}^{nA}Pj$) and a second pulse power $P_B$ ($P_B=\Sigma_{j=nA}^{n}Pj$) are supplied, where nA+nB=n, and where through the respective generation of pulse sequence by means of the respective pulse switches, a respective first sequence of power pulses with the pulse power $P_A$ and a sequence period $T_A$ and second sequence of power pulses with the pulse power $P_B$ and a sequence period $T_B$ are produced; the individual power pulses are chronologically distributed to the sputtering cathodes of the respective sputtering sub-arrangements, where NA corresponds to the number of sputtering cathodes of the first sputtering sub-arrangement A and NB corresponds to the number of sputtering cathodes of the second sputtering sub-arrangement B, where NA+NB=N, and the sequence period $T_A$ corresponds to the sum of the pulse times for the sputtering cathodes of the first sputtering sub-arrangement A and the sequence period $T_B$ corresponds to the sum of the pulse times for the sputtering cathodes of the second sputtering sub-arrangement B ($T_A=\Sigma_{i=1}^{NA}$ and $T_B=\Sigma_{i=NA}^{N}ti$).

12. The method according to claim 11, wherein at least in order to deposit a layer by means of HiPIMS methods, the sputtering arrangement is switched to an interconnection variant with at least two sputtering sub-arrangements and a coating rate gain is achieved in comparison to a HiPIMS method carried out with the sputtering arrangement in the first interconnection variant.

13. The method of claim 11, wherein the sputtering arrangement is assembled in such a way that during the execution of the method, high power pulses are useable, which permit the use of high sputtering power densities of 100 W/cm2 or greater.

14. The method of claim 13, wherein the high sputtering power densities are 300 W/cm2 or greater.

15. The method of claim 11, wherein N=n.

16. The method of claim 11, wherein PA=PB.

17. The method of claim 11, wherein P=PA+PB.

18. The method of claim 11, wherein NA=NB and/or nA=nB.

19. The vacuum coating system of claim 2, wherein the high sputtering power densities are 300 W/cm2 or greater.

* * * * *